(12) United States Patent
Yamai et al.

(10) Patent No.: US 10,969,915 B2
(45) Date of Patent: Apr. 6, 2021

(54) CAPACITIVE SENSOR

(71) Applicant: Alps Alpine Co., Ltd., Tokyo (JP)

(72) Inventors: Tomoyuki Yamai, Niigata-ken (JP); Manabu Yazawa, Niigata-ken (JP); Yuta Hiraki, Niigata-ken (JP); Keita Tashiro, Niigata-ken (JP); Yasuyuki Kitamura, Niigata-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/363,780

(22) Filed: Mar. 25, 2019

(65) Prior Publication Data
US 2019/0220117 A1 Jul. 18, 2019

Related U.S. Application Data

(63) Continuation of application No. PCT/JP2017/027308, filed on Jul. 27, 2017.

(30) Foreign Application Priority Data

Oct. 6, 2016 (JP) .............................. JP2016198391

(51) Int. Cl.
*G06F 3/041* (2006.01)
*G06F 3/044* (2006.01)
(Continued)

(52) U.S. Cl.
CPC ............. *G06F 3/0443* (2019.05); *G01D 5/24* (2013.01); *G01R 27/2605* (2013.01);
(Continued)

(58) Field of Classification Search
CPC ...... G01R 27/2605; G01D 5/24; G06F 3/044; G06F 3/041; G06F 2203/04103; G06F 220/04111; G02B 1/115; H01L 33/42
See application file for complete search history.

(56) References Cited

U.S. PATENT DOCUMENTS

2010/0295819 A1* 11/2010 Ozeki ..................... G06F 3/044
345/174
2011/0227840 A1* 9/2011 Sim ......................... G06F 3/044
345/173
(Continued)

FOREIGN PATENT DOCUMENTS

JP S58-166437 10/1983
JP 2011-192252 9/2011
(Continued)

OTHER PUBLICATIONS

International Search Report for International Application No. PCT/JP2017/027308 dated Aug. 29, 2017.

*Primary Examiner* — Towfiq Elahi
(74) *Attorney, Agent, or Firm* — Beyer Law Group LLP

(57) ABSTRACT

A capacitive sensor has: a base material; a plurality of first transparent electrodes arranged along a first direction on one main surface of the base material; a plurality of second transparent electrodes arranged along a second direction that closes the first direction, the second transparent electrode including conductive nanowires; a link that electrically connects two adjacent first transparent electrodes to each other; a bridge wiring part provided at a portion where the bridge wiring part closes the link, the bridge wiring part electrically connecting two adjacent second transparent electrodes to each other and including an amorphous oxide material; and a reflection reduction layer that has a refractive index higher than the refractive index of the second transparent electrode and lower than the refractive index of the bridge wiring part.

13 Claims, 13 Drawing Sheets

(51) Int. Cl.
*G02B 1/115* (2015.01)
*G01D 5/24* (2006.01)
*H01L 33/42* (2010.01)
*G01R 27/26* (2006.01)

(52) U.S. Cl.
CPC ............. *G02B 1/115* (2013.01); *G06F 3/041* (2013.01); *G06F 3/0446* (2019.05); *H01L 33/42* (2013.01); *G06F 2203/04103* (2013.01); *G06F 2203/04111* (2013.01)

(56) References Cited

U.S. PATENT DOCUMENTS

2016/0284643 A1\* 9/2016 Wong .................... H01L 29/785
2017/0168337 A1\* 6/2017 Tanaka .............. G02F 1/133504

FOREIGN PATENT DOCUMENTS

| JP | 2013-164698 | 8/2013 |
| JP | 2015-529899 | 10/2015 |
| JP | 2016-146153 | 8/2016 |

\* cited by examiner

FIG. 2
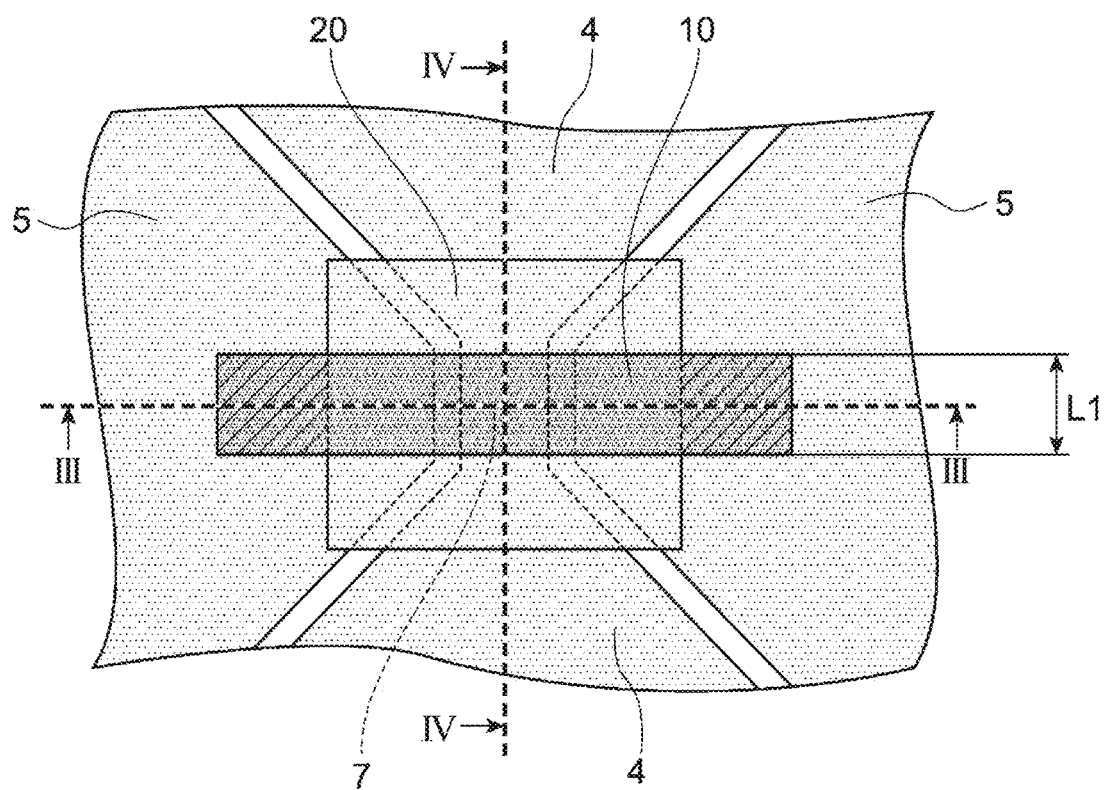
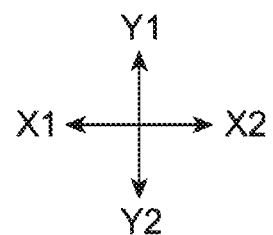

FIG. 10

| REFLECTION REDUCTION LAYER | WIDTH OF BRIDGE WIRING PART | | | | |
|---|---|---|---|---|---|
| REFRACTIVE INDEX | 40 μm | 60 μm | 100 μm | 120 μm | 150 μm |
| 1.68 | INVISIBLE | VISIBLE | VISIBLE | VISIBLE | VISIBLE |
| 1.75 | INVISIBLE | INVISIBLE | INVISIBLE | INVISIBLE | VISIBLE |
| 1.79 | INVISIBLE | INVISIBLE | INVISIBLE | INVISIBLE | INVISIBLE |
| 1.82 | INVISIBLE | INVISIBLE | INVISIBLE | INVISIBLE | INVISIBLE |

FIG. 11

| REFLECTION REDUCTION LAYER | WIDTH OF BRIDGE WIRING PART | | | | |
|---|---|---|---|---|---|
| THICKNESS | 60 μm | 80 μm | 100 μm | 120 μm | 150 μm |
| 0.5 μm | INVISIBLE | VISIBLE | VISIBLE | VISIBLE | VISIBLE |
| 1.0 μm | INVISIBLE | INVISIBLE | VISIBLE | VISIBLE | VISIBLE |
| 2.0 μm | INVISIBLE | INVISIBLE | INVISIBLE | INVISIBLE | INVISIBLE |

FIG. 16

|  | FIRST COMPARATIVE EXAMPLE | FIRST EXAMPLE | SECOND EXAMPLE | THIRD EXAMPLE |
|---|---|---|---|---|
| BASIC STRUCTURE | FIG. 15 | FIG. 12 | FIG. 13 | FIG. 14 |
| OPTICAL TRANSPARENT ADHESIVE LAYER | ABOUT 1.5 | | | |
| REFLECTION REDUCTION LAYER | NONE | ABOUT 1.8 (t=2 μm) | 1.6 TO 1.8 (t=50 nm TO 150 nm) | |
| BRIDGE WIRING PART | ABOUT 2.0 | | | |
| INSULATING LAYER | 1.6 | | | |
| TRANSPARENT ELECTRODE | 1.5 | | | 1.55 TO 1.65 |
| BASE MATERIAL | 1.6 | | | |

FIG. 17

| FOR WHICH TO DECIDE ON VISIBILITY | VISIBILITY CHECK METHOD | FIRST COMPARATIVE EXAMPLE | FIRST EXAMPLE | SECOND EXAMPLE | THIRD EXAMPLE |
|---|---|---|---|---|---|
| TRANSPARENT ELECTRODE | BRIGHT FIELD | B | A | A | A |
|  | DIRK FIELD | B | B | A | A |
| BRIDGE WIRING PART | BRIGHT FIELD | C | A | A | A |
|  | DIRK FIELD | C | C | A | A |
| INSULATING LAYER | BRIGHT FIELD | C | A | A | A |
|  | DIRK FIELD | C | B | B | A |
| APPEARANCE COLOR QUALITY | BRIGHT FIELD | A | B1 | A | A |
|  | DIRK FIELD | A | B2 | B3 | A |
| TOTAL JUDGMENT |  | D | C | B | A |

FIG. 18

| FOR WHICH TO MEASURE | MEASUREMENT ITEM | FIRST COMPARATIVE EXAMPLE | FIRST EXAMPLE | SECOND EXAMPLE | THIRD EXAMPLE |
|---|---|---|---|---|---|
| CONDUCTIVE PART | TOTAL LIGHT TRANSMITTANCE [%] | 89.2 | 88.1 | 88.5 | 88.6 |
|  | Haze [%] | 1.6 | 1.67 | 1.62 | 1.62 |
| INSULATING PART | TOTAL LIGHT TRANSMITTANCE [%] | 92.5 | 90.5 | 90.8 | 91.1 |
|  | Haze [%] | 0.32 | 0.72 | 0.98 | 0.97 |
| Δ | TOTAL LIGHT TRANSMITTANCE [%] | 3.3 | 2.4 | 2.3 | 2.5 |
|  | Haze [%] | 1.28 | 0.95 | 0.64 | 0.65 |

FIG. 19

| FOR WHICH TO MEASURE | | MEASUREMENT ITEM | FIRST COMPARATIVE EXAMPLE | FIRST EXAMPLE | SECOND EXAMPLE | THIRD EXAMPLE |
|---|---|---|---|---|---|---|
| BRIGHT FIELD | TRANSPARENT ELECTRODE | L* | 0.37 | 16.78 | 3.99 | 0.27 |
| | | a* | -0.36 | -14.83 | -0.35 | -0.19 |
| | | b* | 0.57 | 29.57 | 6.74 | 4.42 |
| | INSULATING LAYER | L* | 2.36 | 13.15 | 2.58 | 0.96 |
| | | a* | -1.34 | -12.34 | -1.03 | -0.92 |
| | | b* | 3.78 | 26.94 | 4.23 | 4.53 |
| | BRIDGE WIRING PART | L* | 16.78 | 14.58 | 6.61 | 4.54 |
| | | a* | -12.76 | -14.23 | -4.98 | -4.62 |
| | | b* | 29.56 | 28.61 | 10.57 | 8.37 |
| DIRK FIELD | TRANSPARENT ELECTRODE | L* | 0.23 | 10.21 | 1.5 | 0.16 |
| | | a* | -0.51 | -21.16 | 5.51 | 1.52 |
| | | b* | -0.14 | 5.5 | 1.91 | -0.14 |
| | INSULATING LAYER | L* | 1.12 | 8.11 | 1.2 | 0.59 |
| | | a* | -2.29 | -18.44 | -2.81 | -1.35 |
| | | b* | 0.1 | 8.22 | 0.73 | 0.6 |
| | BRIDGE WIRING PART | L* | 12.15 | 9.17 | 3.61 | 3.61 |
| | | a* | -26.54 | -21.52 | -2.64 | -2.54 |
| | | b* | 5.5 | -3.6 | 0.79 | 0.79 |
| BRIGHT FIELD | Δ TRANSPARENT ELECTRODE INSULATING LAYER | ΔL* | -2.0 | 3.6 | 1.4 | -0.7 |
| | | Δa* | 1.0 | -2.5 | 0.7 | 0.7 |
| | | Δb* | -3.2 | 2.6 | 2.5 | -0.1 |
| | Δ TRANSPARENT ELECTRODE BRIDGE WIRING PART | ΔL* | -16.4 | 2.2 | -2.6 | -4.3 |
| | | Δa* | 12.4 | -0.6 | 4.6 | 4.4 |
| | | Δb* | -29.0 | 1.0 | -3.8 | -4.0 |
| DIRK FIELD | Δ TRANSPARENT ELECTRODE INSULATING LAYER | ΔL* | -0.9 | 2.1 | 0.3 | -0.4 |
| | | Δa* | 1.8 | -2.7 | 8.3 | 2.9 |
| | | Δb* | -0.2 | -2.7 | 1.2 | -0.7 |
| | Δ TRANSPARENT ELECTRODE BRIDGE WIRING PART | ΔL* | -11.0 | -1.1 | -2.4 | -3.0 |
| | | Δa* | 24.3 | 3.1 | -0.2 | 1.2 |
| | | Δb* | -5.4 | 11.8 | -0.1 | -0.2 |

CAPACITIVE SENSOR

CLAIM OF PRIORITY

This application is a Continuation of International Application No. PCT/JP2017/027308 filed on Jul. 27, 2017, which claims benefit of Japanese Patent Application No. 2016-198391 filed on Oct. 6, 2016. The entire contents of each application noted above are hereby incorporated by reference.

BACKGROUND OF THE INVENTION

1. Field of the Invention

The present invention relates to a capacitive sensor, and more particularly to a capacitive sensor in which transparent electrodes including conductive nanowires are provided.

2. Description of the Related Art

Japanese Unexamined Patent Application Publication No. 58-166437 discloses a finger touch detection panel in which X electrodes and Y electrodes, which are indium tin oxide (ITO) layers, are formed on a transparent substrate. In the finger touch detection panel described in Japanese Unexamined Patent Application Publication No. 58-166437, a portion in which X electrodes and Y electrodes cross each other is provided. The Y electrodes are electrically connected to conductive film through openings. When the X electrodes and Y electrodes cross each other on the substrate in this way and bridge wiring parts that electrically connects the Y electrodes are provided, a detection panel can be thinned.

As the trend of the market, it is desired that the shape of a capacitive sensor be a curved surface or a capacitive sensor be capable of being bent. In view of this, a material including conductive nanowires such as gold nanowires, silver nanowires, or copper nanowires, for example, may be used as the material of a transparent electrode in a capacitive sensor.

SUMMARY OF THE INVENTION

However, if a material including conductive nanowires is used as the material of the transparent electrode, a problem arises in that a contact area between the transparent electrode and the bridge wiring part disposed at the intersection of electrodes is comparatively narrowed. The conductive nanowires assure conductivity with the bridge wiring part by conductive nanowires exposed on the surface of the transparent electrode, and also assure transparency by clearances among conductive nanowires. Therefore, if the material of the transparent electrode includes conductive nanowires, a contact between the transparent electrode and the bridge wiring part becomes a point contact. Alternatively, if the material of the bridge wiring part is, for example, an oxide material such as an ITO material, the contact between the transparent electrode and the bridge wiring part becomes a contact between the line or point of a wire and a surface. Therefore, if a material including conductive nanowires is used as the material of the transparent electrode, the contact area between the transparent electrode and the bridge wiring part is comparatively narrowed.

Accordingly, conduction stability may be lowered. Also, if an electro static discharge (ESD) occurs and a large current flows into the contact portion between the transparent electrode and the bridge wiring part, the contact portion may locally generate heat and may be electrically broken down. That is, if a material including conductive nanowires is used as the material of the transparent electrode, the deformation performance of the capacitive sensor is improved, but conduction stability and ESD resistance may be lowered. Also, a crystalline oxide material or metal material is used as the material of the bridge wiring part, resistance during bending may be increased or the bridge wiring part may be broken.

A possible solution to these problems is to increase the size of the bridge wiring part to widen the contact area between the transparent electrode and the bridge wiring part. However, if the size of the bridge wiring part is increased, a problem arises in that the bridge wiring part is easily viewed.

The present invention provides a capacitive sensor that can assure the invisibility of a bridge wiring part, can restrain conduction stability and ESD resistance from being lowered, and can restrain resistance during bending from being increased.

In one aspect, a capacitive sensor in the present invention includes: a base material having a translucent property; a plurality of first transparent electrodes arranged along a first direction in a detection area on one main surface of the base material, each first transparent electrode having a translucent property; a plurality of second transparent electrodes arranged along a second direction that closes the first direction in the detection area, each second transparent electrode having a translucent property and including conductive nanowires; a link provided integrally with the first transparent electrodes, the link electrically connecting two adjacent first transparent electrodes to each other; a bridge wiring part provided separately from the second transparent electrodes, the bridge wiring part electrically connecting two adjacent second transparent electrodes to each other and including an amorphous oxide material; and a reflection reduction layer disposed so as to cover the second transparent electrodes and the bridge wiring part. The reflection reduction layer has a refractive index that is higher than the refractive index of the second transparent electrode and lower than the refractive index of the bridge wiring part.

The second transparent electrode includes conductive nanowires. The bridge wiring part, which is disposed at a portion where the bridge wiring part closes the link as a body separate from the second transparent electrodes and electrically connects two adjacent second transparent electrodes to each other, includes an amorphous oxide material. Therefore, it is possible to improve the deformation performance of the capacitive sensor and to assure a tight contact between the second transparent electrode and the bridge wiring part when compared with a case in which a crystalline oxide material or metal material is used as the material of the bridge wiring part. It is also possible to restrain resistance during bending from being increased.

The reflection reduction layer is disposed on the opposite side to the base material with respect to the bridge wiring part. The reflection reduction layer has a refractive index that is higher than the refractive index of the second transparent electrode and is lower than the refractive index of the bridge wiring part. Therefore, even if the size of the bridge wiring part is increased to widen the contact area between the second transparent electrode and the bridge wiring part, since the reflection reduction layer reduces reflection of light on the front surface of the bridge wiring part, the invisibility of the bridge wiring part can be assured. Therefore, it is possible to increase the size of the bridge wiring part, to enhance conduction stability, and to restrain ESD resistance from being lowered.

In the capacitive sensor described above, the conductive nanowire may be at least one selected from a group of a gold nanowire, a silver nanowire, and a copper nanowire. According to this, it is possible to improve the deformation performance of the capacitive sensor and to more restrain resistance during bending from being increased when compared with a case in which an oxide material such as, for example, an ITO material is used as the material of the first transparent electrode.

In the capacitive sensor described above, the amorphous oxide material may be at least one selected from a group of an amorphous ITO material, an amorphous indium zinc oxide (IZO) material, an amorphous gallium-doped zinc oxide (GZO) material, an amorphous aluminum-doped zinc oxide (AZO) material, and an amorphous fluorine-doped zinc oxide (FTO) material. Therefore, it is possible to improve the deformation performance of the capacitive sensor and to restrain resistance during bending from being increased when compared with a case in which a crystalline ITO material or the like, for example, is used as the material of the bridge wiring part. It is also possible to more enhance the invisibility of the bridge wiring part when compared with a case in which metal nanowires, for example, are used as the material of the bridge wiring part.

In the capacitive sensor described above, the area of a rectangle that includes a contact area between the second transparent electrode and the bridge wiring part may be 10,000 µm2 or more. Therefore, since the contact area between the second transparent electrode and the bridge wiring part is widened, it is possible to restrain the contact portion from being electrically broken down due to an ESD. That is, it is possible to restrain ESD resistance from being lowered.

In the capacitive sensor described above, the area of a rectangle that includes a contact area between the second transparent electrode and the bridge wiring part may be 12,000 µm2 or more. Therefore, since the contact area between the second transparent electrode and the bridge wiring part is widened, it is possible to restrain ESD resistance from being lowered and to stabilize the rise of the electric resistance of the contact portion between the second transparent electrode and the bridge wiring part in a high-temperature, high-humidity reliability test at a temperature of 85° C. and a humidity of 85%.

In the capacitive sensor described above, a dimension of the bridge wiring part (specifically, width of the bridge wiring part) in a direction orthogonal to the second direction may be 100 µm or more. At the contact portion between the second transparent electrode and the bridge wiring part, conductive nanowires included in the second transparent electrode and the amorphous oxide material included in the bridge wiring part are electrically connected to each other. Since the bridge wiring part electrically connects two adjacent second transparent electrodes (one second transparent electrode and another second transparent electrode) to each other, a current flows in the second direction in the bridge wiring part and, in the contact portion as well between the bridge wiring part and the second transparent electrode, a current similarly flows along the second direction in the bridge wiring part. Therefore, when the current that has flowed out of the one second transparent electrode through the bridge wiring part and has arrived at the other second transparent electrode disperses and flows into a plurality of conductive nanowires, which are in contact with the bridge wiring part, in the other second transparent electrode, the current does not evenly flow into the plurality of conductive nanowires, but the closer a conductive nanowire is to the one second transparent electrode, the easier it is for the current to flow into the conductive nanowire. Therefore, if the width of the bridge wiring part is narrow and its length orthogonal to the second direction is small (that is, the width is narrow) at the contact portion as well between the bridge wiring part and the second transparent electrode, a large current easily flows into a conductive nanowire in the vicinity of the one second transparent electrode and the conductive nanowire is easily electrically broken down. In contrast to this, if the bridge wiring part has a large width and the contact portion between the bridge wiring part and the second transparent electrode also has a large width, the current that has flowed through the bridge wiring part can quickly branch and flow into many conductive nanowires. Since, in this case, the possibility that an overcurrent flows into each conductive nanowire is lowered, conductive nanowires are less likely to be electrically broken down. As described above, when the second transparent electrode includes conductive nanowires, the current that has flowed through the bridge wiring part like a bulk branches at portions in contact with conductive nanowires, so the electrical breakdown of a conductive nanowire is likely to occur particularly at a portion where a current flow occurs first in a contact portion. Therefore, by enlarging the width of the bridge wiring part to a certain extent, specifically to 100 µm or more, it is possible to more reduce the possibility that a conductive nanowire is electrically broken down at a contact portion between the bridge wiring part and the second transparent electrode. That is, it is possible to more stably restrain ESD resistance from being lowered.

In the capacitive sensor described above, the refractive index of the reflection reduction layer may be 1.75 or more. Accordingly, even if the dimension of the bridge wiring part in a direction orthogonal to the second direction is 100 micrometers (µm) or more, the invisibility of the bridge wiring part can sometimes be assured.

In the capacitive sensor described above, a dimension of the reflection reduction layer in a direction along the normal of the main surface may be 2 µm or more. Accordingly, even if the dimension of the bridge wiring part in a direction orthogonal to the second direction is 100 µm or more, the invisibility of the bridge wiring part can sometimes be assured.

In the capacitive sensor described above, it may be preferable that the dimension of the reflection reduction layer in a direction along the normal of the main surface be 50 nm to 150 nm and the refractive index of the reflection reduction layer be 1.6 to 1.8. In an example of this, a black reflector is positioned on the base material side of the capacitive sensor.

According to the present invention, it becomes possible to provide a capacitive sensor that can assure the invisibility of a bridge wiring part, can restrain conduction stability and ESD resistance from being lowered, and can restrain resistance during bending from being increased.

BRIEF DESCRIPTION OF THE DRAWINGS

FIG. 2 is a plan view in which the area II in FIG. 1 is enlarged;

FIG. 10 is a table that exemplifies a relationship among the refractive index of the reflection reduction layer, the width of a bridge wiring part, and the invisibility of the bridge wiring part;

FIG. 11 is a table that exemplifies a relationship among the thickness of the reflection reduction layer, the width of the bridge wiring part, and the invisibility of the bridge wiring part;

FIG. 16 is a table that indicates test members manufactured in examples;

FIG. 17 is a table that indicates evaluation results for the invisibility of the test members manufactured in the examples;

FIG. 18 is a table that indicates results in the measurements of optical properties of a transparent electrode area in the test members manufactured in the examples; and FIG. 19 is a table that indicates results in the measurements of color spaces in the test members manufactured in the examples.

DESCRIPTION OF THE PREFERRED EMBODIMENTS

First Embodiment

Figure 1:
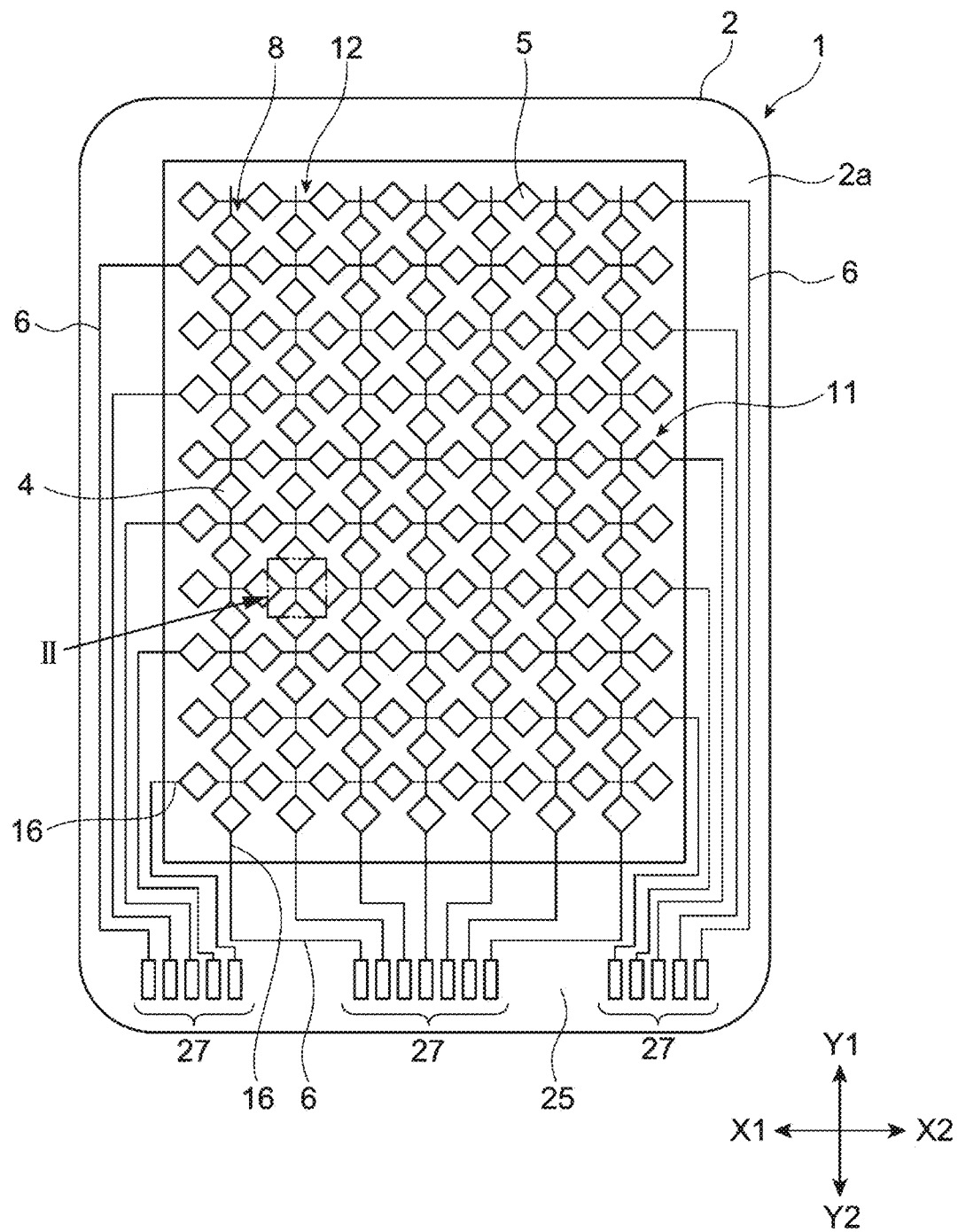
FIG. 1 is a plan view that represents a capacitive sensor according to a first embodiment of the present invention.

Embodiments of the present invention will be described below with reference to the drawings. In the drawings, like elements are assigned like reference characters and detailed descriptions will be appropriately omitted.

Figure 3:
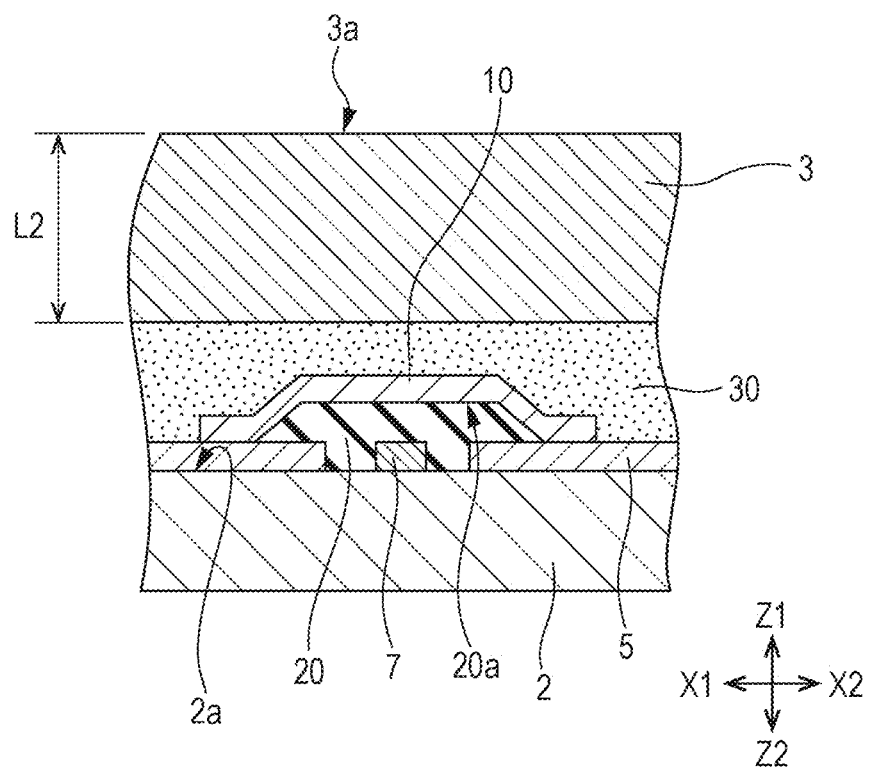
FIG. 3 is a cross-sectional view taken along line in FIG. 2.
Figure 4:
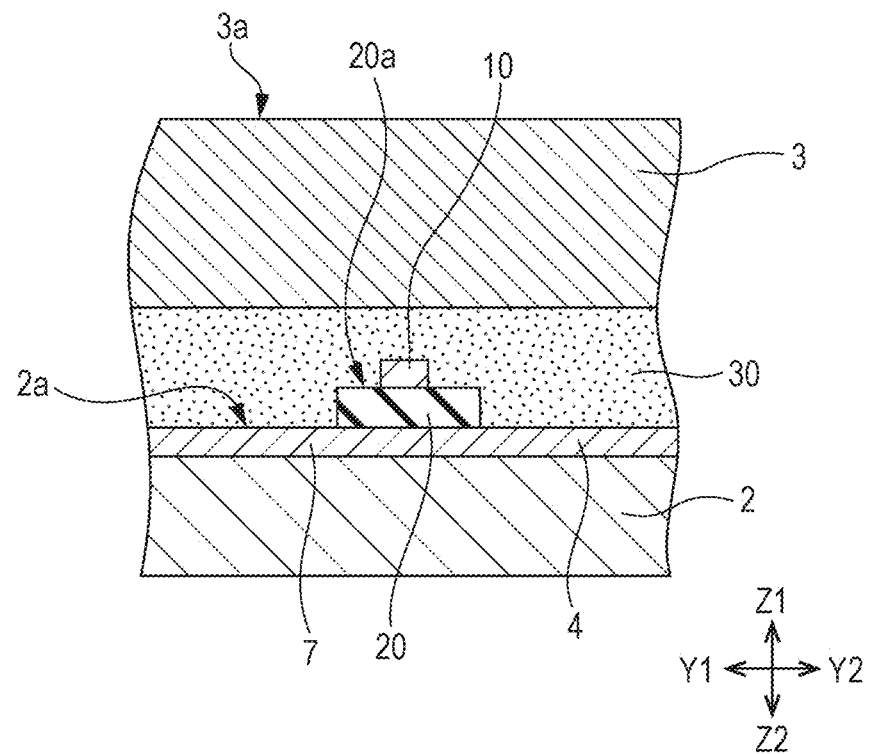
FIG. 4 is a cross-sectional view taken along line IV-IV in FIG. 2.

FIG. 1 is a plan view that represents a capacitive sensor 1 according to this embodiment of the present invention. FIG. 2 is a plan view in which the area II in FIG. 1 is enlarged. FIG. 3 is a cross-sectional view taken along line in FIG. 2. FIG. 4 is a cross-sectional view taken along line IV-IV in FIG. 2. Since transparent electrodes are transparent, they cannot be essentially viewed. In FIGS. 1 and 2, however, the outlines of the transparent electrodes are indicated for easy understanding.

In the specification of this application, "transparency" and "translucent property" indicate a state in which visible light transmittance is 50% or higher (preferably, 80% or higher). Furthermore, it is preferable for the haze value to be 6% or lower. In the specification of this application, "light shielding" and "light shielding property" indicate a state in which visible light transmittance is lower than 50% (preferably, lower than 20%).

As illustrated in FIGS. 1 to 4, a capacitive sensor 1 according to this embodiment has a base material 2, first transparent electrodes 4, second transparent electrodes 5, links 7, bridge wiring parts 10, and a reflection reduction layer 3. The reflection reduction layer 3 is disposed on the opposite side to the base material 2 with respect to the bridge wiring part 10. An optical clear adhesive (OCA) 30 is provided between the base material 2 and the reflection reduction layer 3. An insulating layer 20 is provided between the base material 2 and the bridge wiring part 10. As illustrated in FIG. 3, at the portion where the bridge wiring part 10 is disposed, the optical clear adhesive 30 is disposed between the bridge wiring part 10 and the reflection reduction layer 3.

The base material 2 is formed from a glass base material or a transparent base material such as polyethylene terephthalate (PET), which has a translucent property, in a film shape. The first transparent electrodes 4 and second transparent electrodes 5 are disposed on a main surface of the base material 2. The main surface is one of the main surfaces of the base material 2 and is positioned on the Z1 side, the normal of the main surfaces being along the Z1-Z2 direction, the main surface being sometimes simply referred to below as the front surface 2a. Details of this will be described below. As illustrated in FIG. 3, the reflection reduction layer 3 is disposed on the opposite side to the base material 2 with respect to the bridge wiring part 10 and has a translucent property. Materials of the reflection reduction layer 3 include, for example, plastic base materials. The reflection reduction layer 3 is demanded to have a refractive index that meets a predetermined condition, as will be described later. Therefore, the reflection reduction layer 3 may be formed from a complex material in which particles including a substance having large refractive index, such as zirconia or titania, is dispersed in a matrix made of an organic material.

As illustrated in FIG. 1, the capacitive sensor 1 is composed of a detection area 11 and a non-detection area 25 when viewed from a direction (specifically, Z1-Z2 direction) along the normal of a surface on the same side as the reflection reduction layer 3. The detection area 11 is a region on which a manipulation can be performed with a manipulation body such as a finger. The non-detection area 25 is a region, shaped like a picture frame, that is positioned outside the outer circumference of the detection area 11. The non-detection area 25 is light-shielded by a decorative layer (not illustrated). In the capacitive sensor 1, light (exemplified by external light) from a surface of the reflection reduction layer 3 toward a surface of the base material 2 and light (exemplified by light from the backlight of a display device used in combination with the capacitive sensor 1) from a surface of the base material 2 toward a surface of the reflection reduction layer 3 are less likely to pass through the non-detection area 25.

As illustrated in FIG. 1, first electrode links 8 and second electrode links 12 are provided on the front surface 2a of the base material 2. The first electrode links 8 are placed in the detection area 11. Each first electrode link 8 has a plurality of first transparent electrodes 4. As illustrated in FIGS. 3 and 4, the plurality of first transparent electrodes 4 are disposed on the front surface 2a. Each first transparent electrode 4 is linked through an elongated linking part 7 in the Y1-Y2 direction (first direction). Then, the first electrodes 8, each of which has the plurality of first transparent electrodes 4 linked in the Y1-Y2 direction, are arranged in the X1-X2 direction at intervals. The link 7 is formed integrally with the first transparent electrode 4. The link 7 electrically connects two adjacent first transparent electrodes 4 to each other.

The first transparent electrode 4 and link 7 may be formed from a material that has a translucent property and includes conductive nanowires. As the conductive nanowire, at least one selected from a group of a gold nanowire, a silver nanowire, and a copper nanowire is used. When a material including conductive nanowires is used, it is possible to achieve a high translucent property and low electric resistance for the first transparent electrode 4. Also, when a material including conductive nanowires is used, it is possible to improve the deformation performance of the capacitive sensor 1.

The material including conductive nanowires has not only conductive nanowires but also a transparent resin layer. The conductive nanowires are dispersed in the resin layer. The dispersion property of the conductive nanowires is assured by the resin layer. Materials of the transparent resin layer include, for example, a polyester resin, an acrylic resin, and a polyurethane resin. Since at least part of a plurality of conductive nanowires is brought into mutual contact, the in-plane conductivity of the material including the conductive nanowires is maintained.

The second electrode links 12 are placed in the detection area 11. Each second electrode link 12 has the plurality of second transparent electrodes 5. As illustrated in FIGS. 3 and 4, the plurality of second transparent electrodes 5 are provided on the front surface 2a of the base material 2. Thus, the second transparent electrodes 5 are disposed on the same surface (front surface 2a of the base material 2) as the first transparent electrodes 4. The second transparent electrodes 5 are linked through elongated bridge wiring parts 10 in the X1-X2 direction (second direction). The second electrode links 12, each of which has the plurality of second transparent electrodes 5 linked in the X1-X2 direction, are arranged in the Y1-Y2 direction at intervals. The bridge wiring part 10 is formed separately from the second transparent electrodes 5. The X1-X2 direction crosses the Y1-Y2 direction. For example, the X1-X2 direction perpendicularly crosses the Y1-Y2 direction.

The second transparent electrode 5 is formed from a material that has a translucent property and includes conductive nanowires. The conductive nanowires are as described above in relation to the material of the first transparent electrode 4.

The bridge wiring part 10 is formed from a material that has a translucent property and includes an amorphous oxide material. As the amorphous oxide material, at least one selected from a group of an amorphous ITO material, an amorphous IZO material, an amorphous GZO material, an amorphous AZO material, and an amorphous FTO material may be used.

Alternatively, the bridge wiring part 10 may have a first layer including an amorphous oxide material such as an amorphous ITO material and a second layer composed of a metal that has a lower resistance than the first layer and is transparent. Also, the bridge wiring part 10 may further have a third layer including an amorphous oxide material such as an amorphous ITO material. If the bridge wiring part 10 has a laminated structure composed of the first layer and second layer or a laminated structure composed of the first layer, second layer, and third layer, it is preferable that there be etching selectivity between a combination of the bridge wiring part 10 and the first transparent electrode 4 and a combination of the bridge wiring part 10 and the second transparent electrode 5.

As illustrated in FIGS. 2 to 4, the insulating layer 20 is disposed on the front surface of the link 7, which links first transparent electrodes 4. As illustrated in FIG. 3, the insulating layer 20 fills space between the link 7 and the second transparent electrodes 5 and also slightly rides on the front surfaces of the second transparent electrodes 5. As the insulating layer 20, a novolak resin (resist), for example, is used.

As illustrated in FIGS. 3 and 4, the bridge wiring part 10 is disposed so as to extend from the front surface 20a of the insulating layer 20 to the front surfaces of the second transparent electrodes 5 positioned on both sides of the insulating layer 20 in the X1-X2 direction. The bridge wiring part 10 electrically connects two adjacent second transparent electrodes 5 to each other.

As illustrated in FIGS. 3 and 4, the insulating layer 20 is disposed on the front surface of the link 7, which links first transparent electrodes 4, and the bridge wiring part 10, which connects second transparent electrode 5, is disposed on the front surface of the insulating layer 20. Thus, the insulating layer 20 is present between the first linking part 7 and the second linking part 10, so the first transparent electrode 4 and second transparent electrode 5 are electrically insulated from each other. Since, in this embodiment, the first transparent electrode 4 and second transparent electrode 5 are disposed on the same surface (specifically, front surface 2a of the base material 2), the capacitive sensor 1 can be thinned.

The link 7 illustrated in FIGS. 2 to 4 is integrally formed as part of the first transparent electrode 4, and extends in the Y1-Y2 direction. Also, the bridge wiring part 10 illustrated in FIGS. 2 to 4 is formed on the front surface 20a of the insulating layer 20, which covers the link 7, separately from the second transparent electrodes 5, and extends in the X1-X2 direction. However, forms of the placement of the link 7 and bridge wiring part 10 are not limited to this. For example, the link 7 may be integrally formed as part of the first transparent electrode 4, and extends in the X1-X2 direction. In this case, the link 7 electrically connects two adjacent second transparent electrodes 5 to each other. The bridge wiring part 10 may be formed on the front surface 20a of the insulating layer 20, which covers the link 7, separately from the first transparent electrodes 4, and extends in the Y1-Y2 direction. In this case, the bridge wiring part 10 electrically connects two adjacent first transparent electrodes 4 to each other. In the description of the capacitive sensor 1 according to this embodiment, the bridge wiring part 10 is formed on the front surface 20a of the insulating layer 20, which covers the link 7, separately from the second transparent electrodes 5, and extends in the X1-X2 direction.

As illustrated in FIG. 1, a plurality of wiring parts 6 led out from the first electrode link 8 and second electrode links 12 are formed in the non-detection area 25. Each of the first electrode link 8 and second electrode link 12 is electrically connected to the wiring part 6 through a connection wire 16. Each wiring part 6 is connected to an external connection part 27 that is electrically connected to a flexible printed circuit board (not illustrated). That is, the wiring parts 6 electrically connect the first electrode links 8 and second electrode links 12 to the external connection part 27. The external connection part 27 is electrically connected to the flexible printed circuit board (not illustrated) through, for example, a material that includes a conductive paste or a metal such as Cu, a Cu alloy, a CuNi alloy, Ni, Ag, Au, or the like.

Each wiring part 6 is formed from a material that includes a metal such as Cu, a Cu alloy, a CuNi alloy, Ni, Ag, Au, or the like. The connection wire 16, which is formed from a transparent conductive material such as an ITO material or metal nanowires, extends from the detection area 11 to the non-detection area 25. The wiring part 6 is laminated on the connection wire 16 in the non-detection area 25 and is electrically connected to the connection wire 16.

The wiring part 6 is disposed at a portion, on the front surface 2a of the base material 2, where the non-detection area 25 is positioned. The external connection part 27 is also disposed at a portion, on the front surface 2a of the base material 2, where the non-detection area 25 is positioned, as is the wiring part 6.

In FIG. 1, the wiring part 6 and external connection part 27 are illustrated so as to be viewed for easy understanding. In practice, however, a decorative layer (not illustrated) having a shielding property is provided at a portion where in the non-detection area 25 is positioned. Therefore, the wiring part 6 and external connection part 27 are hidden by the decorative layer and is not visible when the capacitive sensor 1 is viewed from the same side as the reflection reduction layer 3. Any material can be used to form the decorative layer if the material has a light shielding property. The decorative layer may have an insulating property.

In the capacitive sensor 1 according to this embodiment, when a finger used as an example of a manipulation body is caused to come into contact with, for example, a surface 3a of the reflection reduction layer 3 as illustrated in FIG. 3, a capacitance is generated between the finger and the first transparent electrode 4 close to the finger and between the finger and the second transparent electrode 5 close to the finger. The capacitive sensor 1 can calculate the contact position of the finger according to a change in capacitance at this time. Specifically, the capacitive sensor 1 detects the X coordinate of the position of the finger according to a change in capacitance between the finger and the first electrode link 8 and detects the Y coordinate of the position of the finger according to a change in capacitance between the finger and the second electrode link 12 (self-capacitance detection type).

Alternatively, the capacitive sensor 1 may be of mutual capacitance detection type. Specifically, the capacitive sensor 1 may apply a driving voltage to any one of the first electrode link 8 and second electrode link 12, and may detect a change in capacitance between the finger and the other of the first electrode link 8 and the second electrode link 12. Thus, the capacitive sensor 1 detects the X coordinate of the position of the finger from one electrode link and also detects the Y coordinate of the position of the finger from the other electrode link.

If the transparent electrode is formed from a material including conductive nanowires, the contact area between the transparent electrode and the bridge wiring part may become comparatively narrow. The conductive nanowires assure conductivity with the bridge wiring part by conductive wires exposed on the front surface of the transparent electrode. Therefore, if the material of the bridge wiring part includes conductive nanowires, a contact between the transparent electrode and the bridge wiring part becomes a point contact between wires. Alternatively, if the material of the bridge wiring part is, for example, oxide material such as an ITO material, a contact between the transparent electrode and the bridge wiring part becomes a point contact between the line or point of the wire and a surface. Therefore, if a material including conductive nanowires is used as the material of the transparent electrode, the contact area between the transparent electrode and the bridge wiring part may become comparatively narrow.

Accordingly, conduction stability may be lowered. Also, if an electro static discharge (ESD) occurs and a large current flows into the contact portion between the transparent electrode and the bridge wiring part, the contact portion may locally generate heat and may be electrically broken down. That is, if a material including conductive nanowires is used as the material of the transparent electrode, the deformation performance of the capacitive sensor is improved, but conduction stability and ESD resistance may be lowered. Also, a crystalline oxide material or metal material is used as the material of the bridge wiring part, resistance during bending may be increased or the bridge wiring part may be broken.

A possible solution to the above problems is to increase the size of the bridge wiring part to widen the contact area between the transparent electrode and the bridge wiring part. However, if the size of the bridge wiring part is increased, a problem arises in that the bridge wiring part is easily viewed.

In contrast to this, in the capacitive sensor 1 according to this embodiment, the second transparent electrode 5 includes conductive nanowires and the bridge wiring part 10 includes an amorphous oxide material. Therefore, it is possible to improve the deformation performance of the capacitive sensor 1 and to assure a tight contact between the second transparent electrode 5 and the bridge wiring part 10 when compared with a case in which a crystalline oxide material or metal material is used as the material of the bridge wiring part 10. It is also possible to restrain resistance during bending from being increased.

In addition, the reflection reduction layer 3 is disposed on the opposite side to the base material 2 with respect to the bridge wiring part 10. The reflection reduction layer 3 has a refractive index higher than the refractive index of the second transparent electrode 5 and lower than the refractive index of the bridge wiring part 10. Therefore, even if the size of the bridge wiring part 10 is increased to widen the contact area between the second transparent electrode 5 and the bridge wiring part 10, since the reflection reduction layer 3 reduces reflection of light on the front surface of the bridge wiring part 10, the invisibility of the bridge wiring part 10 can be assured. Therefore, it is possible to increase the size of the bridge wiring part 10 and to restrain conduction stability and ESD resistance from being lowered.

If the conductive nanowire is at least one selected from a group of a gold nanowire, a silver nanowire, and a copper nanowire, it is possible to improve the deformation performance of the capacitive sensor 1 and to more restrain resistance during bending from being increased when compared with a case in which an oxide material such as, for example, an ITO material is used as the materials of the first transparent electrode 4 and second transparent electrode 5.

If the amorphous oxide material is at least one selected from a group of an amorphous ITO material, an amorphous IZO material, an amorphous GZO material, an amorphous AZO material, and an amorphous FTO material, it is possible to improve the deformation performance of the capacitive sensor 1 and to restrain resistance during bending from being increased when compared with a case in which a crystalline ITO material or the like, for example, is used as the material of the bridge wiring part 10. It is also possible to more enhance the invisibility of the bridge wiring part 10 when compared with a case in which metal nanowires, for example, are used as the material of the bridge wiring part 10.

Figure 5:
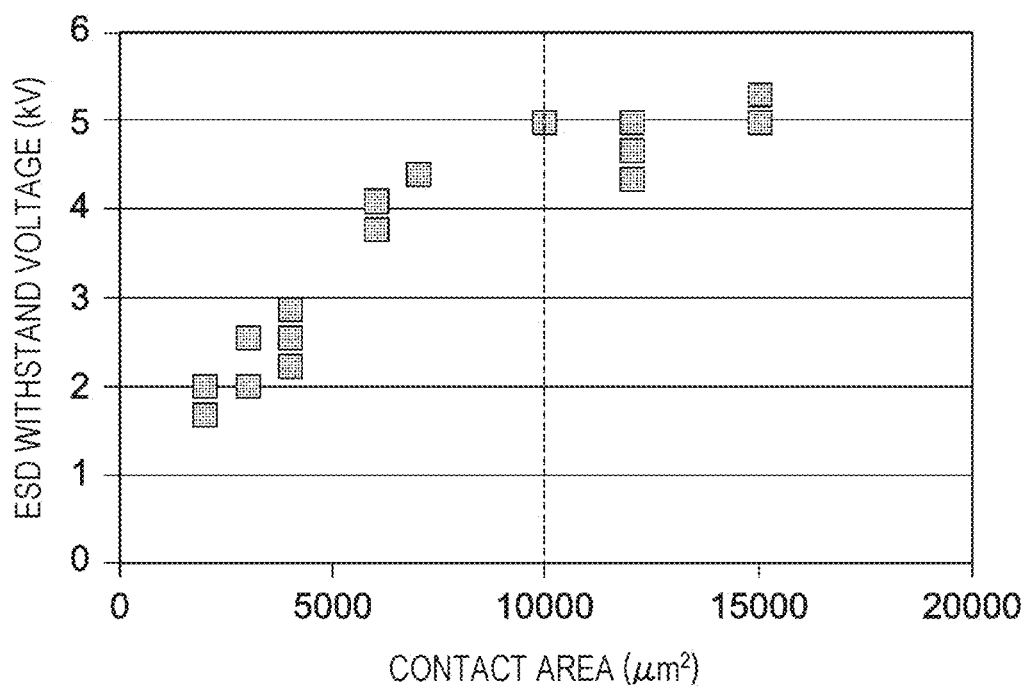
FIG. 5 is a graph illustrating a relationship between a contact area and ESD resistance.
Figure 6:
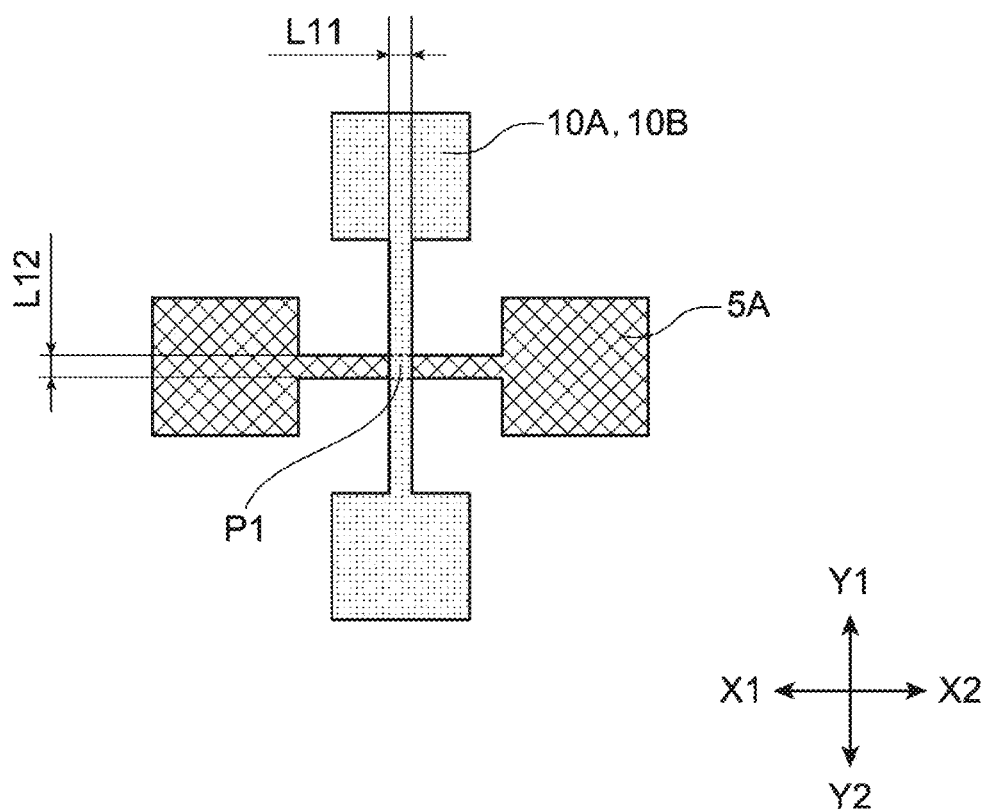
FIG. 6 is a plan view that schematically illustrates a Kelvin pattern.

Next, results of a study conducted by the present inventor will be described with reference to the drawings. FIG. 5 is a graph illustrating a relationship between a contact area and ESD resistance. FIG. 6 is a plan view that schematically illustrates a Kelvin pattern.

The present inventor measured ESD withstand voltage at a contact portion P1 by using a Kelvin pattern as illustrated in FIG. 6. ESD withstand voltage test was performed in a direct application method. In ESD withstand voltage test, therefore, human body model (HBM) test was conducted. This human body model test was based on test method 304 in EIAJ ED-4701/300 in the JEITA standard.

In this test, first samples 5A including silver nanowires and second samples 10A including amorphous ITO crossed each other as illustrated in FIG. 6. The first sample 5A is equivalent to the second transparent electrode 5. The second sample 10A is equivalent to the bridge wiring part 10. In this test, the contact area of the contact portion P1 was varied by varying any one of a dimension L11 of the contact portion P1 in the in the X1-X2 direction and a dimension L12 of the contact portion P1 in the in the Y1-Y2 direction with the other of the dimension L11 and dimension L12 fixed to 100 μm. A relationship between ESD resistance and the contact portion P1 between the first sample 5A and the second sample 10A was as illustrated in FIG. 5.

The horizontal axis of the graph illustrated in FIG. 5 represents the contact area (unit: μm2) of the contact portion P1. The vertical axis of the graph illustrated in FIG. 5 represents ESD withstand voltage (unit: kV). In the specification of this application, the ESD withstand voltage refers to a voltage at the time of the occurrence of destruction (electrical breakdown) due to an ESD.

According to findings that the present inventor obtained in this test, when the contact area of the contact portion P1 was smaller than 10,000 μm2, destruction due to an ESD occurred at the contact portion P1. By contrast, when the contact area of the contact portion P1 was 10,000 μm2 or larger, destruction due to an ESD occurred in the second sample 10A itself, which is equivalent to the bridge wiring part 10, rather than at the contact portion P1.

Due to this, when the contact area of the contact portion P1 is 10,000 μm2 or larger, by widening the contact portion P1 between the first sample 5A, which is equivalent to the second transparent electrode 5, and the second sample 10A, which is equivalent to the bridge wiring part 10, it is possible to restrain the contact portion P1 from being destroyed due to an ESD. That is, it is possible to restrain ESD resistance from being lowered.

Figure 7:
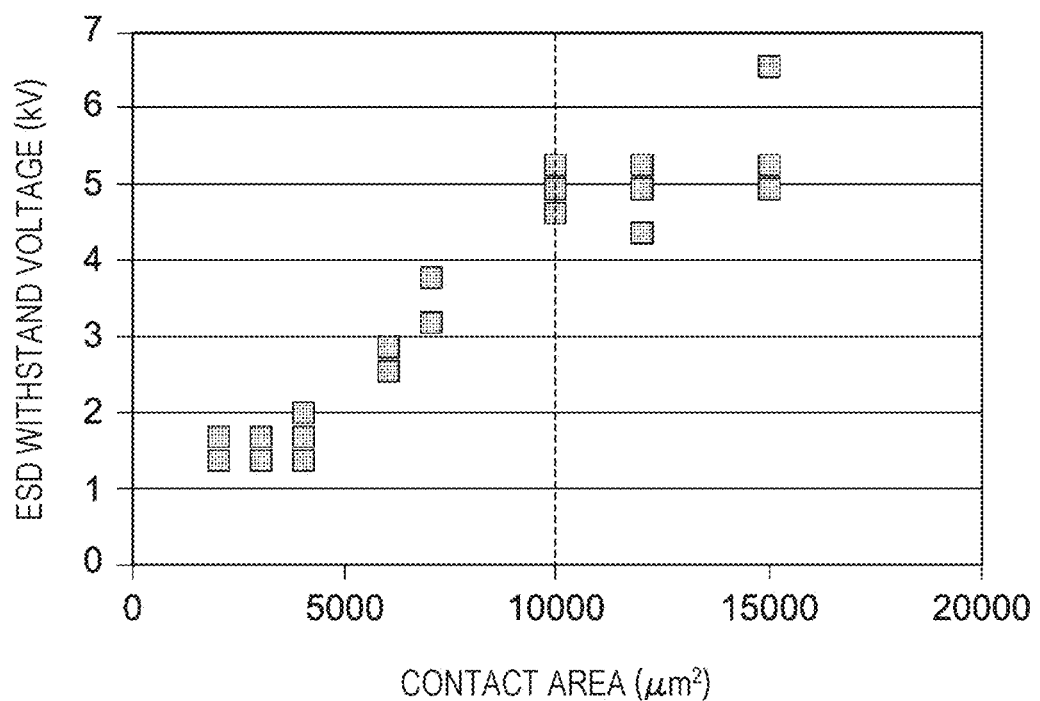
FIG. 7 is a graph that illustrates another relationship between the contact area and ESD resistance.

FIG. 7 is a graph that illustrates another relationship between the contact area and ESD resistance.

The present inventor measured ESD withstand voltage at the contact portion P1 by using another sample. That is, first samples 5A including silver nanowires and second samples 10B having a laminated structure of amorphous ITO, copper (Cu), and amorphous ITO crossed each other as illustrated in FIG. 6. In the second sample 10B, a copper (Cu) layer is provided between two amorphous ITO layers.

The first sample 5A is equivalent to the second transparent electrode 5. The second sample 10B is equivalent to the bridge wiring part 10. The method in this test is as described above with reference to FIGS. 5 and 6. A relationship between ESD resistance and the contact portion P1 between the first sample 5A and the second sample 10B is as illustrated in FIG. 7.

According to findings that the present inventor obtained in this test, when the contact area of the contact portion P1 was smaller than 10,000 μm2, destruction due to an ESD occurred at the contact portion P1. By contrast, when the contact area of the contact portion P1 was 10,000 μm2 or larger, destruction due to an ESD occurred in the second sample 10B itself, which is equivalent to the bridge wiring part 10, rather than at the contact portion P1.

Therefore, even if the bridge wiring part 10 has a laminated structure, when the contact area of the contact portion P1 is 10,000 μm2 or larger, it is possible to restrain the contact portion P1 from being destroyed due to an ESD by widening the contact portion P1 between the first sample 5A, which is equivalent to the second transparent electrode 5, and the second sample 10B, which is equivalent to the bridge wiring part 10. That is, it is possible to restrain ESD resistance from being lowered.

Figure 8:
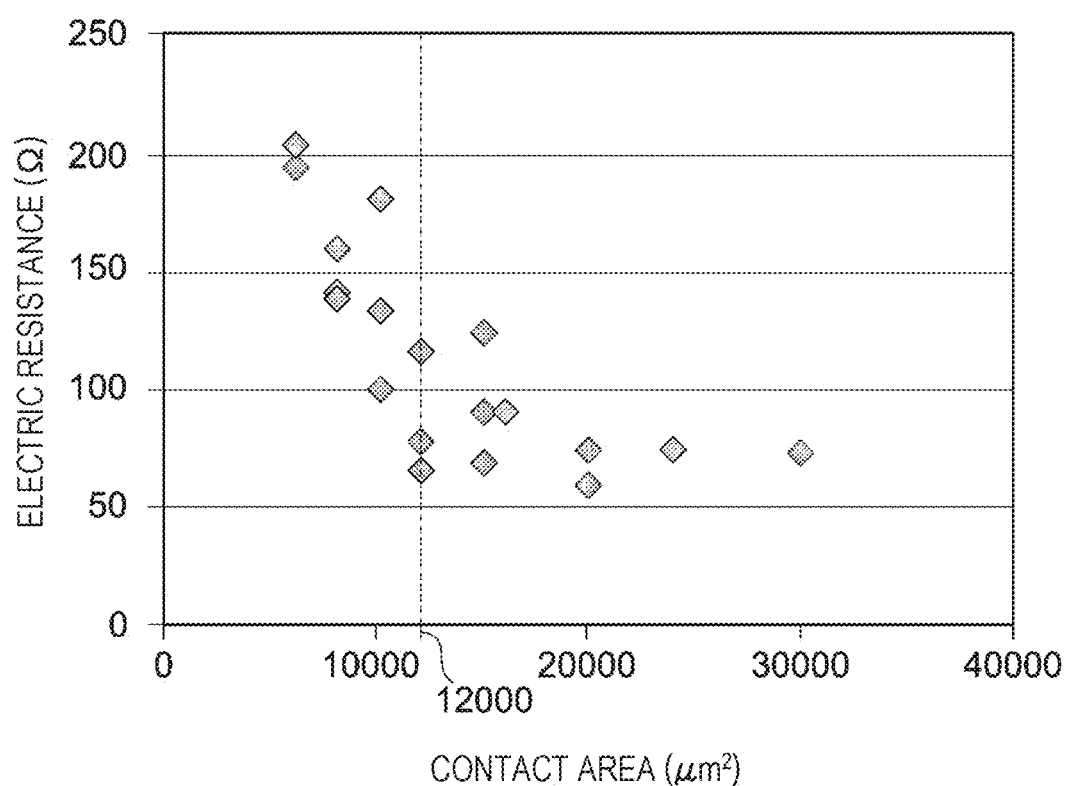
FIG. 8 is a graph that illustrates a relationship between a contact area and electric resistance.

FIG. 8 is a graph that illustrates a relationship between a contact area and electric resistance.

According to findings that the present inventor obtained in this test, the electric resistance of the contact portion P1 was raised before and after an environment test in which samples were left standing in an environment at a temperature of 85° C. and a humidity of 85% for 240 hours (high-temperature, high-humidity reliability test at a temperature of 85° C. and a humidity of 85%). Therefore, the present inventor measured the electric resistance of the contact portion P1 by using the Kelvin pattern described above with reference to FIG. 6 after conducting high-temperature, high-humidity reliability test at a temperature of 85° C. and a humidity of 85%. This environmental test is based on test method 103 in EIAJ ED-4701/100 in the JEITA standard.

Samples used in this test were the first sample 5A including silver nanowires and the second sample 10A including an amorphous ITO material. Other test conditions were as described above with reference to FIGS. 5 and 6. A relationship between electric resistance and the contact portion P1 between the first sample 5A and the second sample 10A was as illustrated in FIG. 8.

The horizontal axis of the graph illustrated in FIG. 8 is the same as the horizontal axis of the graph illustrated in FIG. 5. The vertical axis of the graph illustrated in FIG. 8 represents the electric resistance (unit: Ω) of the contact portion P1.

According to findings that the present inventor obtained in this test, when the contact area of the contact portion P1 was smaller than 12,000 μm2, the rise of the electric resistance according to the contact area was comparatively large. By contrast, when the contact area of the contact portion P1 is 12,000 μm2 or larger, the rise of the electric resistance according to the contact area was comparatively small and was comparatively stable.

Therefore, when the contact area of the contact portion P1 is 12,000 μm2 or larger, it is possible to stabilize the rise of the electric resistance of the contact portion P1 between the first sample 5A, which is equivalent to the second transparent electrode 5, and the second sample 10A, which is equivalent to the bridge wiring part 10, in the high-temperature, high-humidity reliability test at a temperature of 85° C. and a humidity of 85%.

Figure 9A:
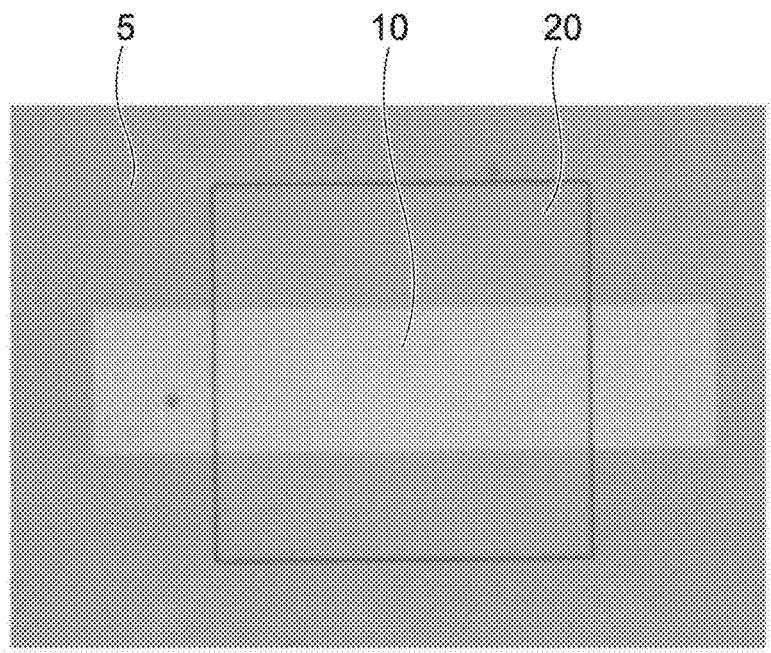
FIGS. 9A and 9B are photos that make a comparison between the presence or absence of a reflection reduction layer.
Figure 9B:
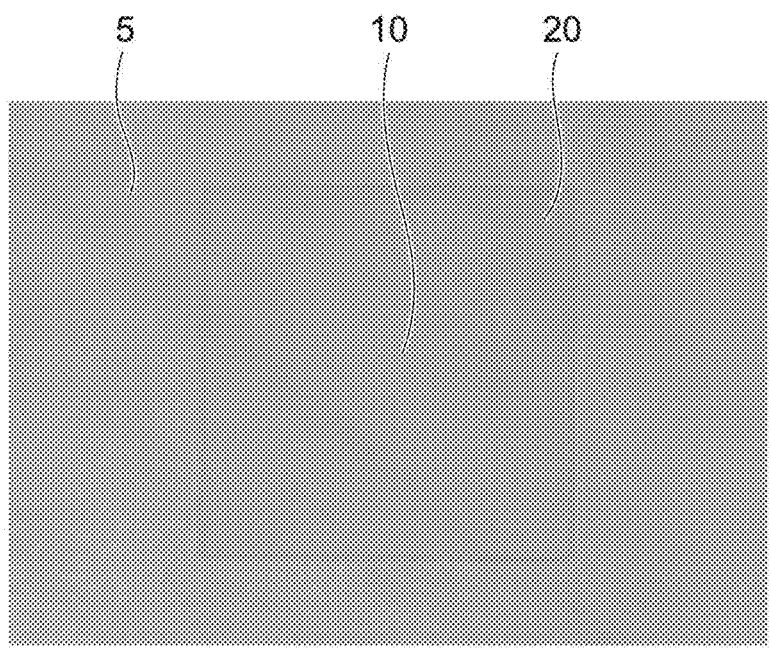

FIGS. 9A and 9B are photos that make a comparison between the presence or absence of a reflection reduction layer. FIG. 9A is a photo indicating a comparative example in which the reflection reduction layer 3 is not provided.

FIG. 9B is a photo indicating an example in which the reflection reduction layer 3 is provided. The refractive index of the reflection reduction layer 3 in the photo illustrated in FIG. 9B was 1.79.

When the reflection reduction layer 3 was not provided as illustrated in FIG. 9A, the edges of the insulating layer 20 could be clearly viewed. Also, the brightness of light reflected on the bridge wiring part 10 differed from the brightness of light reflected on the second transparent electrode 5, so the bridge wiring part 10 could be clearly viewed.

In contrast to this, when the reflection reduction layer 3 was provided as illustrated in FIG. 9B, the edges of the insulating layer 20 were not easily viewed when compared with the comparative example illustrated in FIG. 9A. Also, the brightness of light reflected on the bridge wiring part 10 was substantially equal to the brightness of light reflected on the second transparent electrode 5, so the bridge wiring part 10 could be hardly viewed. As illustrated in FIGS. 9A and 9B, the reflection reduction layer 3 could reduce reflection of light on the front surface of the bridge wiring part 10 and could enhance the invisibility of the bridge wiring part 10. In FIGS. 9A and 9B, no particular member was provided on a surface opposite to the observation side of the capacitive sensor 1. In the description below, observation in a state in which light incident from the observation side can be transmitted to the rear surface side like this will be referred to as observation in the bright field.

FIG. 10 is a table that exemplifies a relationship among the refractive index of the reflection reduction layer, the width of the bridge wiring part, and the invisibility of the bridge wiring part, the reflection reduction layer being placed on a structural body having the bridge wiring part and a layer including silver nanowires. The refractive index of the layer including silver nanowires was 1.5 and the refractive index of the bridge wiring part was 2.0.

A circle (◯) in the table in FIG. 10 indicates that the bridge wiring part 10 was invisible (the bridge wiring part 10 could not be viewed). A cross (x) in the table in FIG. 10 indicates that the bridge wiring part 10 was viewed.

According to findings that the present inventor obtained in the test described above with reference to FIGS. 5 to 8, at least any of the dimension L11 of the contact portion P1 in the X1-X2 direction and the dimension L12 of the contact portion P1 in the Y1-Y2 direction needs to be 100 μm or more. At least any of the dimension L11 and dimension L12 is equivalent to the dimension (width) L1 of the bridge wiring part 10 in a direction orthogonal to the second direction, as illustrated in FIG. 2.

At the contact portion between the second transparent electrode 5 and the bridge wiring part 10, conductive nanowires included in the second transparent electrode 5 and the amorphous oxide material included in the bridge wiring part 10 are electrically connected to each other. Since the bridge wiring part 10 electrically connects two adjacent second transparent electrodes (one second transparent electrode and another second transparent electrode) to each other, a current flows in the second direction in the bridge wiring part 10 and, in the contact portion as well between the bridge wiring part 10 and the second transparent electrode 5, a current similarly flows along the second direction in the bridge wiring part 10.

Therefore, when the current that has flowed out of the one second transparent electrode 5 through the bridge wiring part 10 and has arrived at the other second transparent electrode 5 disperses and flows into a plurality of conductive nanowires, which are in contact with the bridge wiring part 10, in the other second transparent electrode 5, the current does not evenly flow into the plurality of conductive nanowires, but the closer a conductive nanowire is to the one second transparent electrode 5, the easier it is for the current to flow into the conductive nanowire. Therefore, if the width (dimension L1) of the bridge wiring part 10 is narrow and its length orthogonal to the second direction is small (that is, the width is narrow) at the contact portion as well between the bridge wiring part 10 and the second transparent electrode 5, a large current easily flows into a conductive nanowire in the vicinity of the one second transparent electrode 5 and the conductive nanowire is easily electrically broken down.

In contrast to this, if the bridge wiring part 10 has a large width and the contact portion between the bridge wiring part 10 and the second transparent electrode 5 also has a large width, the current that has flowed through the bridge wiring part 10 can quickly branch and flow into many conductive nanowires. Since, in this case, the possibility that an overcurrent flows into each conductive nanowire is lowered, conductive nanowires are less likely to be electrically broken down.

As described above, when the second transparent electrode 5 includes conductive nanowires, the current that has flowed through the bridge wiring part 10 like a bulk branches at portions in contact with conductive nanowires, so the electrical breakdown of a conductive nanowire is likely to occur particularly at a portion where a current flow occurs first in a contact portion. Therefore, by enlarging the width of the bridge wiring part 10 to a certain extent, specifically to 100 μm or more, it is possible to more reduce the possibility that a conductive nanowire is electrically broken down at a contact portion between the bridge wiring part 10 and the second transparent electrode 5.

If the refractive index of the reflection reduction layer 3 is 1.75 or more when the dimension L1 is 100 μm or more, as illustrated in FIG. 10, the invisibility of the bridge wiring part 10 can sometimes be assured. Specifically, if the refractive index of the reflection reduction layer 3 is 1.75, when the dimension L1 is 100 μm or more and 120 μm or less, the invisibility of the bridge wiring part 10 can be assured. If the refractive index of the reflection reduction layer 3 is 1.79 or more and 1.82 or less, when the dimension L1 is 100 μm or more and 150 μm or less, the invisibility of the bridge wiring part 10 can be assured.

FIG. 11 is a table that exemplifies a relationship among the thickness of the reflection reduction layer, the width of a bridge wiring part, and the invisibility of the bridge wiring part. A circle (◯) and a cross (x) in the table in FIG. 11 are as described above with reference to FIG. 10.

As described above with reference to FIG. 10, the dimension (width) L1 of the bridge wiring part 10 in a direction orthogonal to the second direction needs to be 100 μm or more. As illustrated in FIG. 11, if the dimension L1 is 100 μm or more, when the dimension (thickness) L2 (see FIG. 3) of the reflection reduction layer 3 in a direction along the normal of the front surface 2a of the base material 2 is 2 μm or more, the invisibility of the bridge wiring part 10 can sometimes be assured. Specifically, if the dimension L2 is 2 μm, when the dimension L1 is 100 μm or more and 150 μm or less, the invisibility of the bridge wiring part 10 can be assured.

So far, the first embodiment and its application examples have been described. However, the present invention is not limited to these examples. For example, the scope of the present invention also includes embodiments obtained as a result of adding or deleting constituent element to or from the first embodiment or its application examples, performing design changes to the first embodiment or its application examples, or appropriately combining features in embodiments without departing from the intended scope of the present invention; the addition, deletion, design change, or combination is effected by a person having ordinary skill in the art.

Figure 12:
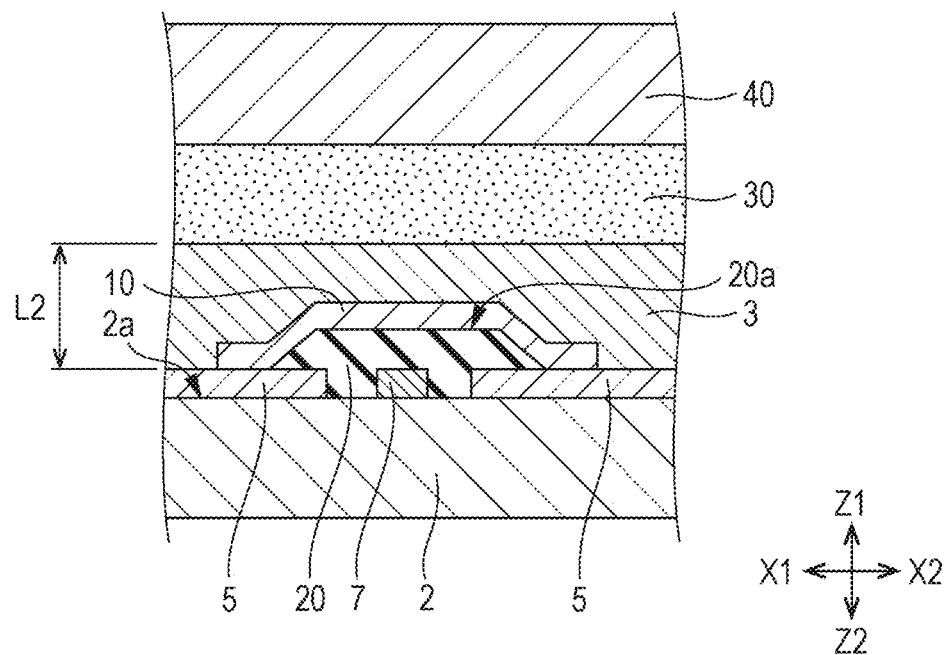
FIG. 12 is a cross-sectional view that conceptually illustrates the structure of a capacitive sensor according to another example in the first embodiment of the present invention.

Although, in the description above, the optical clear adhesive 30 is placed, as one aspect, between the reflection reduction layer 3 and a structural body having first electrode links 8 and second electrode links 12, which are disposed on the base material 2, this is not a limitation. For example, the reflection reduction layer 3 may be disposed so as to cover the structural body having first electrode links 8 and second electrode links 12, which are disposed on the base material 2, as illustrated in FIG. 12. Such a structure can be obtained by a method in which a component used to form the reflection reduction layer 3 is applied onto the above structural body and this coating is cured to form the reflection reduction layer 3.

Also, a cover member 40 may be provided on the reflection reduction layer 3 with the optical clear adhesive 30 intervening between them, as illustrated in FIG. 12. There is no limitation on the material forming the cover member 40. The cover member 40 may be formed from a resin material such as polycarbonate (PC) or an inorganic material such as glass, or may have a laminated structure composed of different materials. The results illustrated in FIGS. 5 to 11 were obtained by using the structure illustrated in FIG. 12.

In the capacitive sensor 1 according to the first embodiment of the present invention, the reflection reduction layer 3 disposed so as to cover a structural body having first electrode links 8 and second electrode links 12, which are disposed on the base material 2, contributes to enhancing the invisibility of the bridge wiring part 10 in observation in the bright field.

Second Embodiment

Next, a capacitive sensor 1A according to a second embodiment will be described with reference to FIG. 13. The same structures as in the first embodiment will be assigned the same reference characters and detailed descriptions will be omitted.

Recently, a light emitting element that can locally emit light like an organic EL device (OLED) may be placed on a surface (specifically, rear surface) on the opposite side to the manipulation side (observation side) of a capacitive sensor. In this case, a black reflector is positioned on the rear surface side of the capacitive sensor at a portion where the light emitting element does not emit light. In the specification of this application, observation in a state in which the rear surface side of the capacitive sensor is not such that light can be transmitted and in which a black reflector is positioned on the rear surface side of the capacitive sensor will be referred to as observation in the dark field.

Since the influence of light from the rear surface side of a capacitive sensor differs between in the bright field and in the dark field, when the capacitive sensor is observed in the dark field, invisibility may differ from when the capacitive sensor is observed in the bright field. In particular, it may be preferable to further improve the invisibility, in the dark field, of the bridge wiring part 10 for which invisibility could be improved in the bright field due to the structure in the first embodiment. The capacitive sensor 1A in the second embodiment of the present invention can improve invisibility in the dark field.

Figure 13:
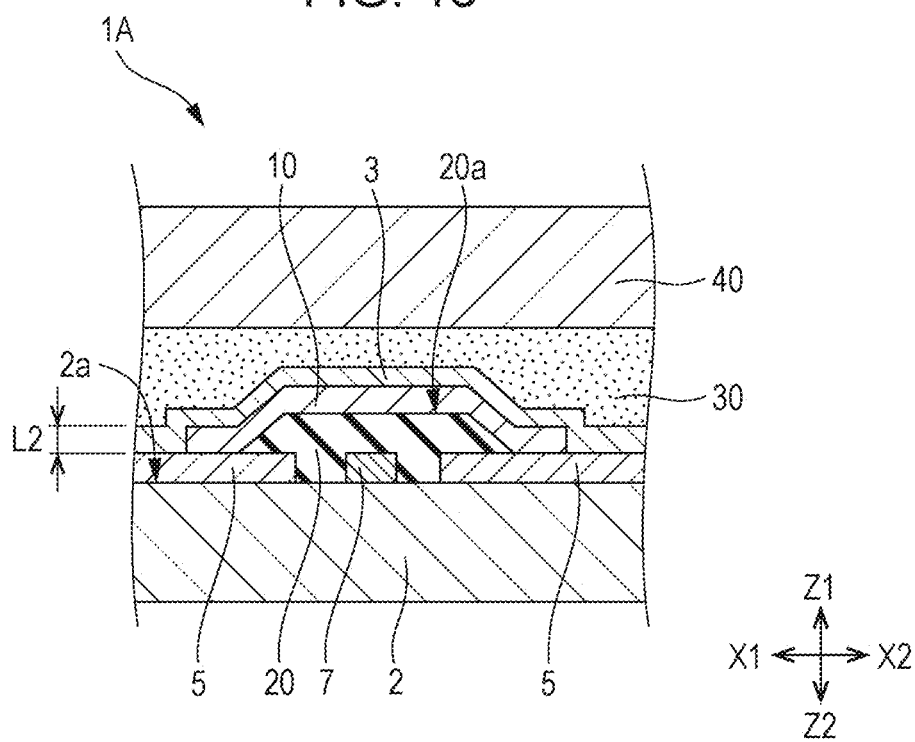
FIG. 13 is a cross-sectional view that conceptually illustrates the structure of a capacitive sensor according to a second embodiment of the present invention.

FIG. 13 is a cross-sectional view that conceptually illustrates the structure of the capacitive sensor 1A according to the second embodiment of the present invention, the cross-sectional view taking, as a cross section, a plane including the direction (specifically, X1-X2 direction) in which second transparent electrodes 5 are arranged, as in FIGS. 3 and 12. The capacitive sensor 1A according to the second embodiment has a basic structure in common with the capacitive sensor 1 according to the first embodiment. In particular, the reflection reduction layer 3 is disposed so as to directly cover a structural body having first electrode links 8 and second electrode links 12, which are disposed on the base material 2, as illustrated in FIG. 12. The capacitive sensor 1A according to the second embodiment differs from the structure illustrated in FIG. 12 in that the thickness of the reflection reduction layer 3 is comparatively small.

As described above with reference to FIG. 11, the thickness of the reflection reduction layer 3 in the capacitive sensor 1 according to the first embodiment is preferably 2 μm or more. In contrast to this, the reflection reduction layer 3 of the capacitive sensor 1A according to the second embodiment preferably has a refractive index that is higher than the refractive index of the second transparent electrode 5 and lower than the refractive index of the bridge wiring part 10, and the thickness of the reflection reduction layer 3 is preferably 50 nm or more and 150 nm or less. A preferable example of the range of this refractive index is 1.6 to 1.8. When the reflection reduction layer 3 that has the refractive index and thickness described above is provided, it becomes easy for the capacitive sensor 1A to assure the invisibility of the bridge wiring part 10 even in the dark field. To more stably assure the invisibility of the bridge wiring part 10 in the dark field, it may be preferable for the reflection reduction layer 3 having a refractive index in the above range to have a thickness of 50 nm or more and 110 nm or less. Thus, when the reflection reduction layer 3 becomes relatively thin as described above, the capacitive sensor 1A may be superior in refractive index to the capacitive sensor 1 according to the first embodiment. Specifically, when the reflection reduction layer 3 has a thickness in μm units as with the capacitive sensor 1 in the first embodiment, the reflection reduction layer 3 may be formed from a material, such as a dry film resist, that is comparatively hard. In this case, if the thickness of the reflection reduction layer 3 is about 2 μm or more, the flexibility of the capacitive sensor 1 may become less likely to be increased.

Now, the above contents will be described from another viewpoint. If the refractive index of the second transparent electrode 5 is 1.5 to 1.7 and the refractive index of the bridge wiring part 10 is 1.9 to 2.1, the product of the refractive index and thickness of the reflection reduction layer 3 is preferably 80 nm or more and 250 nm or less, more preferably 85 nm or more and 180 nm or less, and particularly preferably 90 nm or more and 150 nm or less.

Third Embodiment

Next, a capacitive sensor 1B according to a third embodiment of the present invention will be described with reference to FIG. 14. The same structures as in the first embodiment will be assigned the same reference characters and detailed descriptions will be omitted.

According to the capacitive sensor 1A according to the second embodiment, when the refractive index and thickness of the reflection reduction layer 3 is appropriately controlled, it is possible to stably assure invisibility and particularly the invisibility of the bridge wiring part 10 even in the dark field. As described above, in the dark field, it is not easy to assure invisibility when compared with the bright field, and the color of each element is easily enhanced when compared with the bright field. In the capacitive sensor 1B according to the third embodiment, to more enhancing invisibility in observation in the dark field, the absolute value of the difference between the refractive index of the second transparent electrode 5 and the refractive index of the insulating layer 20 is 0.05 or less, as will be described below.

Figure 14:
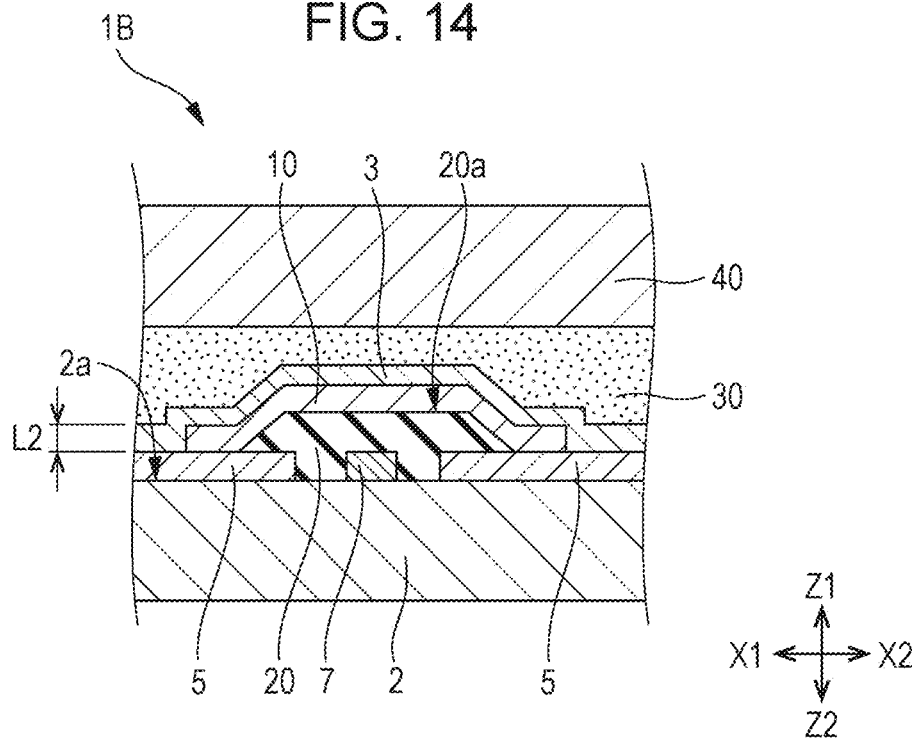
FIG. 14 is a cross-sectional view that conceptually illustrates the structure of a capacitive sensor according to a third embodiment of the present invention.

FIG. 14 is a cross-sectional view that conceptually illustrates the structure of the capacitive sensor 1B according to the third embodiment of the present invention, the cross-sectional view taking, as a cross section, a plane including the direction (specifically, X1-X2 direction) in which second transparent electrodes 5 are arranged, as in FIGS. 3, 12, and 13.

As illustrated in FIG. 14, the capacitive sensor 1B according to the third embodiment has a basic structure in common with the capacitive sensor 1A according to the second embodiment. The capacitive sensor 1B according to the third embodiment differs from the capacitive sensor 1A in the second embodiment in that the absolute value of the difference between the refractive index of the second transparent electrode 5 and the refractive index of the insulating layer 20 is 0.05 or less. Since the absolute value of the difference between the refractive index of the second transparent electrode 5 and the refractive index of the insulating layer 20 is 0.05 or less, even in observation in the dark field, the difference between the color of the area where the second transparent electrode 5 is positioned and the color of the area where the insulating layer 20 is positioned is lessened and it becomes easy to assure the invisibility of the insulating layer 20. Any specific method may be used to reduce the absolute value of the difference between the refractive index of the second transparent electrode 5 and the refractive index of the insulating layer 20. In an example, assuming that the second transparent electrode 5 further has an overcoat layer in a resin layer in which conductive nanowires are dispersed, the refractive index of the second transparent electrode 5 is changed by adjusting the composition and thickness of this overcoat layer.

EXAMPLES

Figure 15:
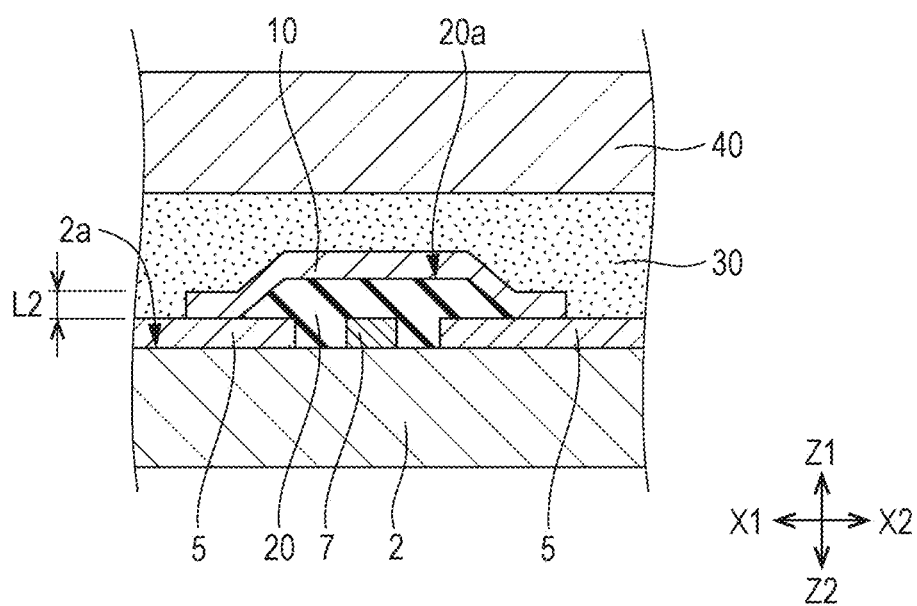
FIG. 15 is a cross-sectional view that conceptually illustrates the structure of a capacitive sensor according to a comparative example.

The present invention will be further described by using examples below. In the description below, a first comparative example that has a structure as illustrated in FIG. 15 will be used. The capacitive sensor in the first comparative example illustrated in FIG. 15 differs from the capacitive sensors 1, 1A, and 1B according to the embodiments of the present invention mainly in that the reflection reduction layer 3 is not provided. The present invention is not limited to these examples.

First, test members were manufactured that have the structures illustrated in FIGS. 12 to 15 and also have a refractive index indicated in FIG. 16 in each layer (for the reflection reduction layer 3, its thickness t was also indicated). These test members will be referred to as a first example (structure in FIG. 12), a second example (structure in FIG. 13), a third example (structure in FIG. 14), and the first comparative example (structure in FIG. 15). The following evaluation and measurement were conducted for each test member.
(1) Evaluation of Invisibility The test members were visually observed in the bright field or dark field, and the visibility of the bridge wiring part was evaluated at the following three levels. Results are indicated in FIG. 17.

A: The bridge wiring part could not be viewed.
B: The bridge wiring part could be mostly viewed.
C: The bridge wiring part could be viewed.

Next, the quality of the color of the appearance of the test members was evaluated in the bright field and dark field. Results are indicated in FIG. 17. The symbols in columns in FIG. 17 have the following means.

A: The test member was uniformly colorless.
B1: The test member was yellowish overall.
B2: The test member had glare.
B3: The area of the transparent electrodes was reddish.

Overall evaluation (total judgment) was made at the following four levels according to the above evaluation of visibility and colors. Results are indicated in FIG. 17.

A: The test member was particularly superior in invisibility.
B: The test member was superior in invisibility.
C: The test member had invisibility.
D: The test member had no invisibility.
(2) Measurement of the Optical Properties of the Transparent Electrode Area The area on which the transparent electrodes (specifically, first transparent electrodes 4 and second transparent electrodes 5) are positioned is composed of a portion (conductive part) that has conductivity because conductor nanowires are dispersed in a resin layer and a portion (insulated part) in which conductive nanowires have been removed by etching or the like and conductivity has thereby lowered. Total light transmittance stipulated in JIS K7375: 2008 and haze stipulated in JIS K7136: 2000 were measured for the conductive part and insulated part. The absolute value ($\Delta$) of the difference between the conductive part and the insulated part was obtained for these results. Results are indicated in FIG. 18.
(3) Measurement of Color Spaces The test members were observed in the bright field and dark field, and the $L^*$ value, $a^*$ value, and $b^*$ value stipulated in CIE 1976 $L^*a^*b^*$ color space were measured for the area in which the bridge wiring part is positioned and the area in which the insulating layer is positioned. The differences ($\Delta L^*$, $\Delta a^*$, and $\Delta b^*$) of the color space values in the individual areas from the color space values in the transparent electrode area were also obtained. Measurement results and calculation results are indicated in FIG. 19.

As indicated in FIGS. 17 to 19, with the first comparative example, the color difference in the bridge wiring part was large, so the bridge wiring part was easily viewed both in the bright field and the dark field. In contrast to this, with the first example, the differences ($\Delta L^*$, $\Delta a^*$, and $\Delta b^*$) of color space values were small overall, and thereby invisibility was improved. In the dark field, however, $\Delta b^*$ values were comparatively large, and thereby a yellow color was enhanced a little. In the dark field, the $L^*$ values were large overall, so when the test member was visually observed in the dark field, the test member had a tendency to be recognized as glare. With the second example, a reduction in the differences ($\Delta L^*$, $\Delta a^*$, and $\Delta b^*$) of color space values in observation in the dark field was recognized when compared with the first example, so glare was less likely to occur in visual observation in the dark field. With the third example, the value of $a^*$ in the transparent electrode area in observation in the dark field was greatly reduced (from 5.51 to 1.52) when compared with the second example, and the reddish color recognized in observation of the second example in the dark field was improved.

What is claimed is:

1. A capacitive sensor comprising:
   a base having a translucent property, the base having a detection area on a main surface thereof;
   a plurality of first transparent electrodes arranged along a first direction in the detection area, each first transparent electrode having a translucent property, each first transparent electrode including a transparent resin layer and conductive nanowiers dispersed in the resin layer;
   a plurality of second transparent electrodes arranged along a second direction crossing the first direction in the detection area, each second transparent electrode having a translucent property, each second transparent electrode including a transparent resin layer including conductive nanowiers dispersed in the resin layer;
   a plurality of link portions provided integrally with the first transparent electrodes and made of a material having a translucent property and including conductive nanowires, each link portion electrically connecting two adjacent first transparent electrodes to each other;
   a plurality of bridge wiring parts provided separately from the second transparent electrodes, each bridge wiring part electrically connecting two adjacent second transparent electrodes to each other and formed of an amorphous oxide material; and
   a reflection reduction layer provided so as to cover the plurality of second transparent electrodes and the plurality of bridge wiring parts, wherein the reflection reduction layer has a refractive index of 1.75 or more, which is higher than a refractive index of the second transparent electrodes and lower than a refractive index of the bridge wiring parts.

2. The capacitive sensor according to claim 1, wherein the conductive nanowires are at least one selected from a group consisting of gold nanowires, silver nanowires, and copper nanowires.

3. The capacitive sensor according to claim 1, wherein the amorphous oxide material is at least one selected from a group consisting of an amorphous ITO material, an amorphous IZO material, an amorphous GZO material, an amorphous AZO material, and an amorphous FTO material.

4. The capacitive sensor according to claim 1, wherein each bridge wiring part has such a size that a rectangular area that includes a contact area between the second transparent electrode and the bridge wiring part is equal to or greater than 10,000 µm².

5. The capacitive sensor according to claim 1, wherein each bridge wiring part has such a size that a rectangular area that includes a contact area between the second transparent electrode and the bridge wiring part is equal to or greater than 12,000 µm².

6. The capacitive sensor according to claim 1, wherein a width of the bridge wiring part in a direction orthogonal to the second direction is equal to or greater than 100 µm.

7. The capacitive sensor according to claim 1, wherein a thickness of the reflection reduction layer in a direction normal to the main surface is 2 µm or more.

8. The capacitive sensor according to claim 1, wherein a thickness of the reflection reduction layer in a direction normal to the main surface is 50 nm to 150 nm, and the refractive index of the reflection reduction layer is 1.75 to 1.8.

9. The capacitive sensor according to claim 1, wherein the bridge wiring parts are substantially invisible from above the reflection reduction layer.

10. The capacitive sensor according to claim 1, further comprising:
    an optical clear adhesive layer formed on the reflection reduction layer; and
    a cover layer provided over the reflection reduction layer with the optical clear adhesive layer interposed therebetween.

11. The capacitive sensor according to claim 1, wherein the refractive index of the reflection reduction layer is from 1.79 to 1.82.

12. The capacitive sensor according to claim 1, wherein the reflection reduction layer includes a matrix made of an organic material and particles containing a material having a high refractive index such that the reflection reduction layer have the refractive index within a predetermined range.

13. The capacitive sensor according to claim 12, wherein the material having a high refractive index includes at least one of zirconia and titania.

* * * * *